United States Patent
Ka

(10) Patent No.: US 10,186,306 B2
(45) Date of Patent: Jan. 22, 2019

(54) APPARATUS AND METHOD FOR NON-VOLATILE MEMORY ADDRESS DECODING

(71) Applicant: SK hynix Inc., Icheon-si, Gyeonggi-do (KR)

(72) Inventor: Dong Yoon Ka, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/489,983

(22) Filed: Apr. 18, 2017

(65) Prior Publication Data

US 2018/0090192 A1 Mar. 29, 2018

(30) Foreign Application Priority Data

Sep. 28, 2016 (KR) .................. 10-2016-0125088

(51) Int. Cl.
G11C 8/10 (2006.01)
G11C 8/06 (2006.01)
G11C 29/14 (2006.01)

(52) U.S. Cl.
CPC ............... *G11C 8/10* (2013.01); *G11C 8/06* (2013.01); *G11C 29/14* (2013.01)

(58) Field of Classification Search
CPC ...................................................... G11C 8/10
See application file for complete search history.

(56) References Cited

U.S. PATENT DOCUMENTS

| | | | | |
|---|---|---|---|---|
| 6,006,313 A | * | 12/1999 | Fukumoto | G11C 29/02 365/200 |
| 6,202,180 B1 | * | 3/2001 | Nose | G11C 29/76 365/200 |
| 6,233,182 B1 | * | 5/2001 | Satou | G11C 29/006 365/200 |
| 6,337,832 B1 | * | 1/2002 | Ooishi | G11C 7/1045 365/219 |
| 6,452,859 B1 | * | 9/2002 | Shimano | G11C 8/08 365/230.06 |
| 6,510,102 B2 | * | 1/2003 | Fister | G11C 29/18 365/201 |
| 6,556,504 B2 | * | 4/2003 | Kwon | G11C 16/08 365/189.02 |
| 6,671,787 B2 | * | 12/2003 | Kanda | G11C 7/1021 365/189.02 |
| 6,882,592 B2 | * | 4/2005 | Noguchi | G06F 11/1008 365/205 |
| 6,889,268 B2 | * | 5/2005 | Chae | G06F 13/28 365/185.11 |
| 7,222,272 B2 | * | 5/2007 | Takazawa | G11C 29/26 714/702 |

(Continued)

FOREIGN PATENT DOCUMENTS

KR 1020130046767 A 5/2013

*Primary Examiner* — Anthan Tran
*Assistant Examiner* — Mushfique Siddique
(74) *Attorney, Agent, or Firm* — William Park & Associates Ltd.

(57) ABSTRACT

The semiconductor device may include an address conversion circuit configured for generating a variable address. The semiconductor device may include a column decoder configured for generating a first output select signal or a second output select signal from a column address based on the variable address.

16 Claims, 6 Drawing Sheets

(56) References Cited

U.S. PATENT DOCUMENTS

| | | | |
|---|---|---|---|
| 7,895,484 B2* | 2/2011 | Tanaka | G01R 31/31726 365/201 |
| 9,001,598 B2* | 4/2015 | Hwang | G06F 1/12 365/191 |
| 9,401,219 B2* | 7/2016 | Shim | G11C 17/18 |
| 9,466,396 B2* | 10/2016 | Kim | G11C 29/023 |
| 9,508,410 B1* | 11/2016 | Baek | G11C 7/222 |
| 9,620,194 B1* | 4/2017 | Lee | G11C 7/1039 |
| 9,779,837 B1* | 10/2017 | Kwak | G11C 8/06 |
| 9,899,070 B2* | 2/2018 | Kirsch | G11C 8/10 |
| 2002/0075749 A1* | 6/2002 | Fister | G11C 29/18 365/236 |
| 2002/0085419 A1* | 7/2002 | Kwon | G11C 16/08 365/185.17 |
| 2004/0252564 A1* | 12/2004 | Do | G11C 29/46 365/201 |
| 2005/0149792 A1* | 7/2005 | Furuyama | G01R 31/31701 714/724 |
| 2007/0153619 A1* | 7/2007 | Choo | G11C 7/1045 365/230.06 |
| 2009/0219775 A1* | 9/2009 | Hur | G11C 29/12 365/201 |
| 2010/0110812 A1* | 5/2010 | Suzuki | G11C 7/1066 365/201 |
| 2012/0262996 A1* | 10/2012 | Akamatsu | G11C 29/12015 365/189.05 |
| 2012/0314520 A1* | 12/2012 | Vogelsang | G11C 8/14 365/200 |
| 2013/0107649 A1* | 5/2013 | Cho | G11C 29/06 365/201 |
| 2014/0226423 A1* | 8/2014 | Akamatsu | G11C 29/12015 365/201 |
| 2015/0332786 A1* | 11/2015 | Lee | G11C 29/06 365/201 |
| 2016/0291082 A1* | 10/2016 | Kwak | G01R 31/31701 |
| 2017/0018314 A1* | 1/2017 | Chae | G11C 29/38 |
| 2017/0263335 A1* | 9/2017 | Kwak | G11C 8/06 |

* cited by examiner

US 10,186,306 B2

APPARATUS AND METHOD FOR NON-VOLATILE MEMORY ADDRESS DECODING

CROSS-REFERENCE TO RELATED APPLICATION

The present application claims priority under 35 U.S.C. § 119(a) to Korean Patent Application No. 10-2016-0125088 filed on Sep. 28, 2016 in the Korean Intellectual Property Office, which is incorporated herein by reference in its entirety.

BACKGROUND

1. Technical Field

Embodiments of the present disclosure may generally relate to a semiconductor device and method relating to address decoding.

2. Related Art

A semiconductor device may perform an active operation, a read operation, and a write operation. The active operation is performed through operations of generating a row address by decoding an address and activating a word line to be accessed by the row address. Meanwhile, the read operation and the write operation are performed through operations of generating a column address by decoding an address and enabling an output select signal to be accessed by the column address.

SUMMARY

In an embodiment, a method of operating a semiconductor device may be provided. In an embodiment, a semiconductor device may be provided. The semiconductor device may include an address conversion circuit configured for generating a variable address. The semiconductor device may include a column decoder configured for generating a first output select signal or a second output select signal from a column address based on the variable address.

In an embodiment, a semiconductor device may include a counter configured for generating a counting address which is counted, based on an operating pulse and a flag signal. The semiconductor device may include an address selection circuit configured for selecting and outputting the counting address or a row address as a variable address based on the flag signal. The semiconductor device may include a column decoder configured for generating a first output select signal or a second output select signal from a column address based on the variable address.

DETAILED DESCRIPTION

Hereinafter, a semiconductor device will be described below with reference to the accompanying drawings through various examples of embodiments.

Various embodiments may be directed to a semiconductor device which performs address decoding.

According to the embodiments, the performance counts of active operations and precharge operations may be decreased by substituting a row address with a column address, whereby power consumption and operation speed may be improved.

Figure 1:
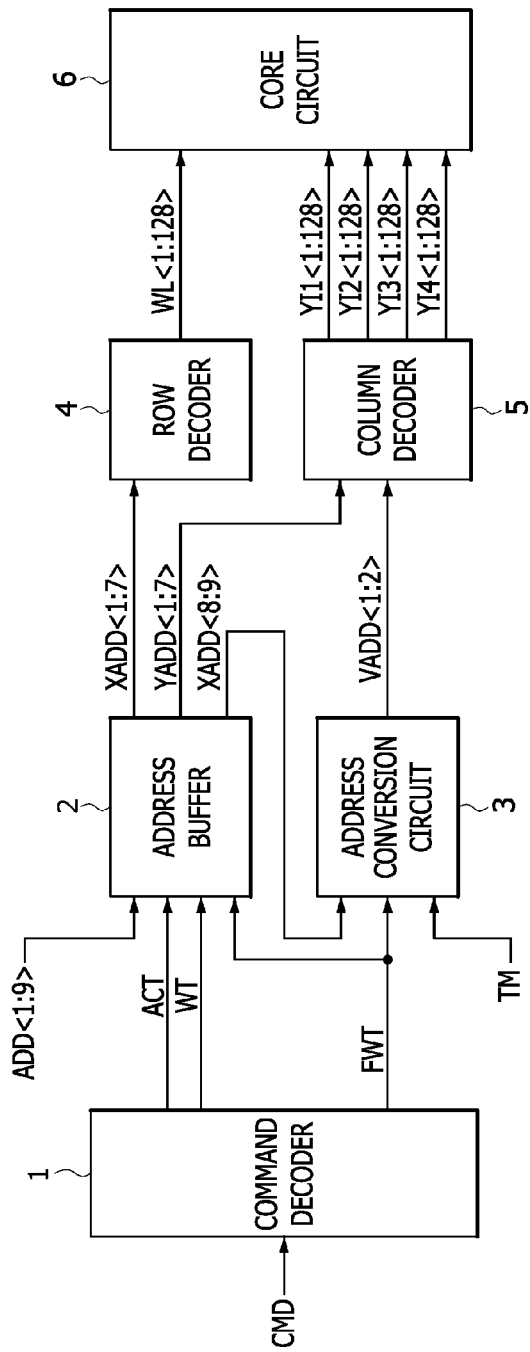
FIG. 1 is a block diagram illustrating a representation of an example of the configuration of a semiconductor device in accordance with an embodiment.

Referring to FIG. 1, a semiconductor device in accordance with an embodiment may include a command decoder 1, an address buffer 2, an address conversion circuit 3, a row decoder 4, a column decoder 5, and a core circuit 6.

The command decoder 1 may decode a command CMD, and generate an active signal ACT, a write signal WT and an operation control signal FWT. The command CMD may be applied from at least one external device among a memory controller, a host and test equipment. The command CMD may be realized as a signal which includes a plurality of bits, according to an embodiment. The command CMD may be transmitted through the same line as a line through which an address ADD<1:9> is transmitted. The active signal ACT may be enabled for an active operation of selectively activating a word line. The write signal WT may be enabled for a write operation of selectively enabling an output select signal to input data. The operation control signal FWT may be enabled to perform an internal operation accompanied by address substitution. In an embodiment, the operation control signal FWT may be enabled to perform a write operation while substituting a row address with a column address. According to an embodiment, the operation control signal FWT may be enabled to perform an operation of substituting a column address with a row address. According to an embodiment, the operation control signal FWT may be enabled to perform another internal operation such as a read operation instead of a write operation.

The address buffer 2 may generate a first bit group XADD<1:7> of a row address, a second bit group XADD<8:9> of the row address and a column address YADD<1:7> from the address ADD<1:9> in response to the active signal ACT, the write signal WT and the operation control signal FWT. The address buffer 2 may generate the first bit group XADD<1:7> of the row address and the second bit group XADD<8:9> of the row address by buffering the address ADD<1:9> in the case where the active signal ACT is enabled. The address buffer 2 may generate the column address YADD<1:7> by buffering the address ADD<1:9> in the case where the write signal WT or the operation control signal FWT is enabled. The numbers of bits included in the address ADD<1:9>, the first bit group XADD<1:7> of the row address, the second bit group XADD<8:9> of the row address and the column address YADD<1:7> may be set differently according to an embodiment.

The address conversion circuit 3 may generate a variable address VADD<1:2> from the second bit group XADD<8:9> of the row address in response to a test mode signal TM and the operation control signal FWT. The address conversion circuit 3 may generate the variable address VADD<1:2> which is sequentially counted, in the case where both the test mode signal TM and the operation control signal FWT are enabled. For example, the variable address VADD<1:2> generated in the address conversion circuit 3 may be generated by being sequentially counted to have a logic level combination in the sequence of 'L, L,' 'L, H' and 'H, H.' The case where the variable address VADD<1:2> is 'H, L' means that the logic level of the first bit VADD<1> of the variable address VADD<1:2> is a logic high level and the logic level of the second bit VADD<2> of the variable address VADD<1:2> is a logic low level. The test mode signal TM may be enabled to enter a test mode. The address conversion circuit 3 may generate the variable address VADD<1:2> by buffering the second bit group XADD<8:9> of the row address with the test mode signal TM disabled. The address conversion circuit 3 may generate the variable address VADD<1:2> in response to only the operation control signal FWT regardless of the test mode signal TM, according to an embodiment. The address conversion circuit 3 may generate the variable address VADD<1:2> in response to various internal control signals including an address, according to an embodiment. Further, the logic levels of the signals may be different from or the opposite of those described. For example, a signal described as having a logic "high" level may alternatively have a logic "low" level, and a signal described as having a logic "low" level may alternatively have a logic "high" level.

The row decoder 4 may generate a word line signal WL<1:128> in response to the first bit group XADD<1:7> of the row address. The row decoder 4 may generate the word line signal WL<1:128> including bits which are selectively enabled depending on the logic level combination of the first bit group XADD<1:7> of the row address. Bits to be enabled in the word line signal WL<1:128> depending on the logic level combination of the first bit group XADD<1:7> of the row address may be set differently according to an embodiment. The number of bits included in the word line signal WL<1:128> may be set differently according to an embodiment.

The column decoder 5 may decode the column address YADD<1:7> in response to the variable address VADD<1:2>, and generate a first output select signal YI1<1:128>, a second output select signal YI2<1:128>, a third output select signal YI3<1:128> and a fourth output select signal YI4<1:128>. The column decoder 5 may selectively generate one of the first output select signal YI1<1:128>, the second output select signal YI2<1:128>, the third output select signal YI3<1:128> and the fourth output select signal YI4<1:128> by decoding the column address YADD<1:7> depending on the logic level combination of the variable address VADD<1:2>. The column decoder 5 may generate the first output select signal YI1<1:128> by decoding the column address YADD<1:7> in the case where the logic level combination of the variable address VADD<1:2> is 'L, L.' The case where the logic level combination of the variable address VADD<1:2> is 'L, L' means that all the bits included in the variable address VADD<1:2> are set to the logic low level. The column decoder 5 may generate the second output select signal YI2<1:128> by decoding the column address YADD<1:7> in the case where the logic level combination of the variable address VADD<1:2> is 'H, L.' The case where the logic level combination of the variable address VADD<1:2> is 'H, L' means that the logic level of the first bit VADD<1> of the variable address VADD<1:2> is the logic high level and the logic level of the second bit VADD<2> of the variable address VADD<1:2> is the logic low level. The column decoder 5 may generate the third output select signal YI3<1:128> by decoding the column address YADD<1:7> in the case where the logic level combination of the variable address VADD<1:2> is 'L, H.' The case where the logic level combination of the variable address VADD<1:2> is 'L, H' means that the logic level of the first bit VADD<1> of the variable address VADD<1:2> is the logic low level and the logic level of the second bit VADD<2> of the variable address VADD<1:2> is the logic high level. The column decoder 5 may generate the fourth output select signal YI4<1:128> by decoding the column address YADD<1:7> in the case where the logic level combination of the variable address VADD<1:2> is 'H, H.' The case where the logic level combination of the variable address VADD<1:2> is 'H, H' means that all the bits included in the variable address VADD<1:2> are set to the logic high level. Further, the logic levels of the signals may be different from or the opposite of those described. For example, a signal described as having a logic "high" level may alternatively have a logic "low" level, and a signal described as having a logic "low" level may alternatively have a logic "high" level.

The core circuit 6 may perform an internal operation in response to the word line signal WL<1:128>, the first output select signal YI1<1:128>, the second output select signal YI2<1:128>, the third output select signal YI3<1:128> and the fourth output select signal YI4<1:128>. In the case where an active operation is performed, the core circuit 6 may activate a word line corresponding to a bit which is enabled in the word line signal WL<1:128>. In the case where a write operation is performed while substituting a row address with a column address, the core circuit 6 may be inputted with data through input/output lines (not illustrated) which are activated by the first output select signal YI1<1:128>, the second output select signal YI2<1:128>, the third output select signal YI3<1:128> and the fourth output select signal YI4<1:128> generated sequentially.

Figure 2:
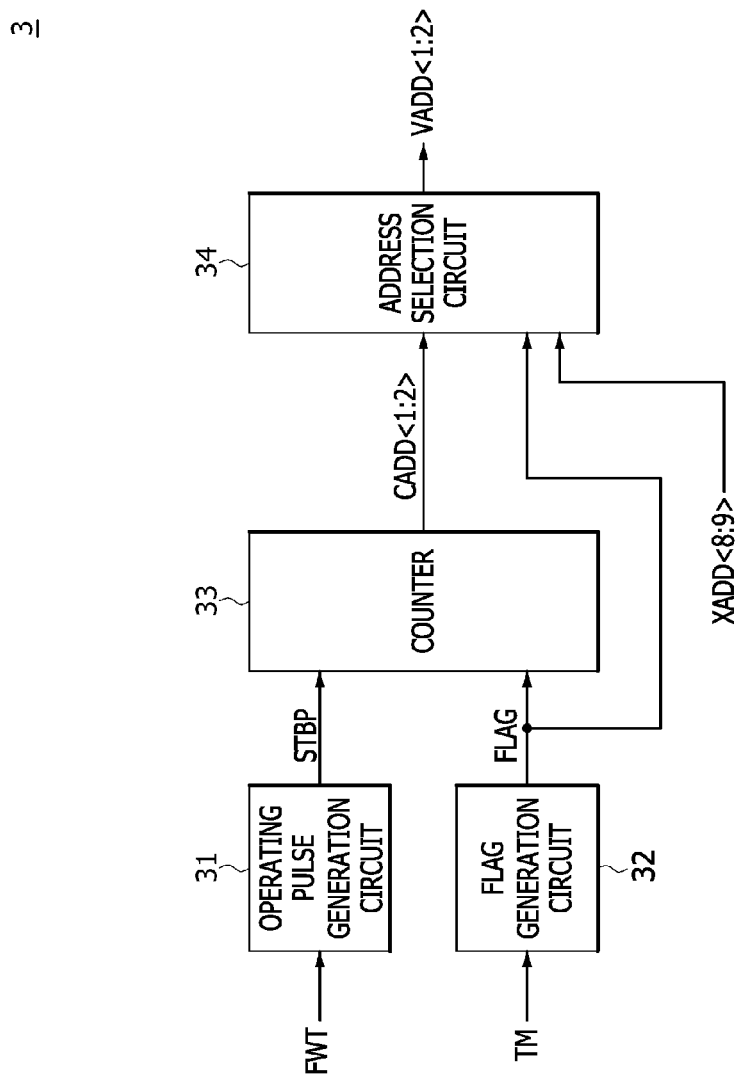
FIG. 2 is a block diagram illustrating a representation of an example of the configuration of the address conversion circuit included in the semiconductor device illustrated in FIG. 1.

Referring to FIG. 2, the address conversion circuit 3 may include an operating pulse generation circuit 31, a flag generation circuit 32, a counter 33, and an address selection circuit 34.

The operating pulse generation circuit 31 may generate an operating pulse STBP in response to the operation control signal FWT. The operating pulse generation circuit 31 may generate the operating pulse STBP in the case where the operation control signal FWT is enabled as a write operation is performed while substituting a row address with a column address.

The flag generation circuit 32 may generate a flag signal FLAG in response to the test mode signal TM. The flag generation circuit 32 may generate the flag signal FLAG in the case where the test mode signal TM is enabled as a test mode is entered.

The counter 33 may generate a counting address CADD<1:2> in response to the operating pulse STBP and the flag signal FLAG. The counter 33 may sequentially count the counting address CADD<1:2> in the case where both the operating pulse STBP and the flag signal FLAG are generated. The counting address CADD<1:2> may be generated by being sequentially counted to have a logic level combination in the sequence of 'L, L,' 'L, H' and 'H, H.' The case where the counting address CADD<1:2> is 'H, L' means that the logic level of the first bit CADD<1> of the counting address CADD<1:2> is a logic high level and the logic level of the second bit CADD<2> of the counting address CADD<1:2> is a logic low level. Further, the logic levels of the signals may be different from or the opposite of those described. For example, a signal described as having a logic "high" level may alternatively have a logic "low" level, and a signal described as having a logic "low" level may alternatively have a logic "high" level.

The address selection circuit 34 may generate the variable address VADD<1:2> from the counting address CADD<1:2> or the second bit group XADD<8:9> of the row address in response to the flag signal FLAG. The address selection circuit 34 may output the variable address VADD<1:2> by buffering the counting address CADD<1:2> in the case where the flag signal FLAG is enabled. The address conversion circuit 34 may output the variable address VADD<1:2> by buffering the second bit group XADD<8:9> of the row address in the case where the flag signal FLAG is disabled.

Figure 3:
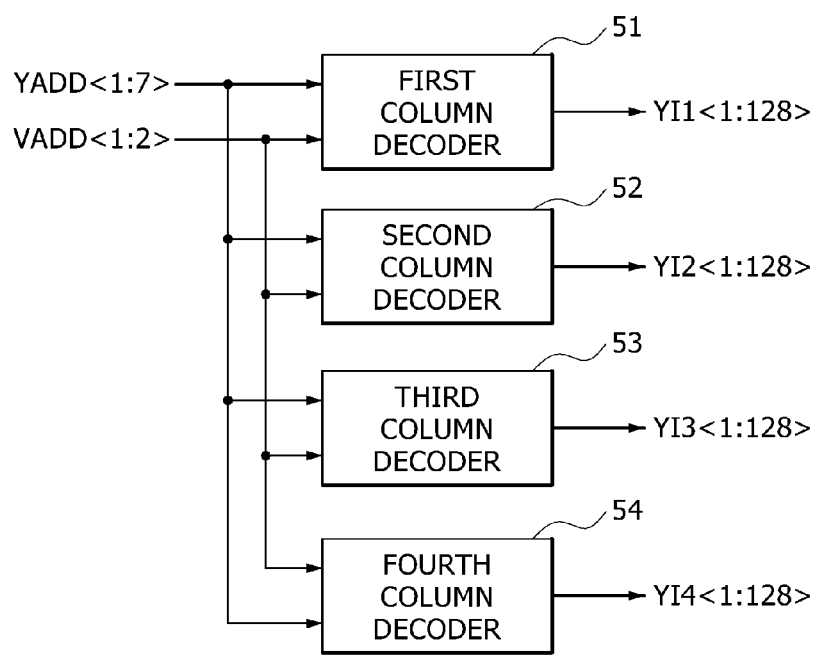
FIG. 3 is a block diagram illustrating a representation of an example of the configuration of the column decoder included in the semiconductor device illustrated in FIG. 1.

Referring to FIG. 3, the column decoder 5 may include a first column decoder 51, a second column decoder 52, a third column decoder 53, and a fourth column decoder 54.

The first column decoder 51 may generate the first output select signal YI1<1:128> by decoding the column address YADD<1:7> in the case where the variable address VADD<1:2> is a first logic level combination. The first logic level combination of the variable address VADD<1:2> may be set to 'L, L.' The first logic level combination may be set variously according to embodiments. Bits to be enabled in the first output select signal YI1<1:128> depending on the logic level combination of the column address YADD<1:7> may be set variously according to embodiments. Further, the logic levels of the signals may be different from or the opposite of those described. For example, a signal described as having a logic "high" level may alternatively have a logic "low" level, and a signal described as having a logic "low" level may alternatively have a logic "high" level.

The second column decoder 52 may generate the second output select signal YI2<1:128> by decoding the column address YADD<1:7> in the case where the variable address VADD<1:2> is a second logic level combination. The second logic level combination of the variable address VADD<1:2> may be set to 'H, L.' The second logic level combination may be set variously according to embodiments. Bits to be enabled in the second output select signal YI2<1:128> depending on the logic level combination of the column address YADD<1:7> may be set variously according to embodiments. Further, the logic levels of the signals may be different from or the opposite of those described. For example, a signal described as having a logic "high" level may alternatively have a logic "low" level, and a signal described as having a logic "low" level may alternatively have a logic "high" level.

The third column decoder 53 may generate the third output select signal YI3<1:128> by decoding the column address YADD<1:7> in the case where the variable address VADD<1:2> is a third logic level combination. The third logic level combination of the variable address VADD<1:2> may be set to 'L, H.' The third logic level combination may be set variously according to embodiments. Bits to be enabled in the third output select signal YI3<1:128> depending on the logic level combination of the column address YADD<1:7> may be set variously according to embodiments. Further, the logic levels of the signals may be different from or the opposite of those described. For example, a signal described as having a logic "high" level may alternatively have a logic "low" level, and a signal described as having a logic "low" level may alternatively have a logic "high" level.

The fourth column decoder 54 may generate the fourth output select signal YI4<1:128> by decoding the column address YADD<1:7> in the case where the variable address VADD<1:2> is a fourth logic level combination. The fourth logic level combination of the variable address VADD<1:2> may be set to 'H, H.' The fourth logic level combination may be set variously according to embodiments. Bits to be enabled in the fourth output select signal YI4<1:128> depending on the logic level combination of the column address YADD<1:7> may be set variously according to embodiments. Further, the logic levels of the signals may be different from or the opposite of those described. For example, a signal described as having a logic "high" level may alternatively have a logic "low" level, and a signal described as having a logic "low" level may alternatively have a logic "high" level.

Figure 4:
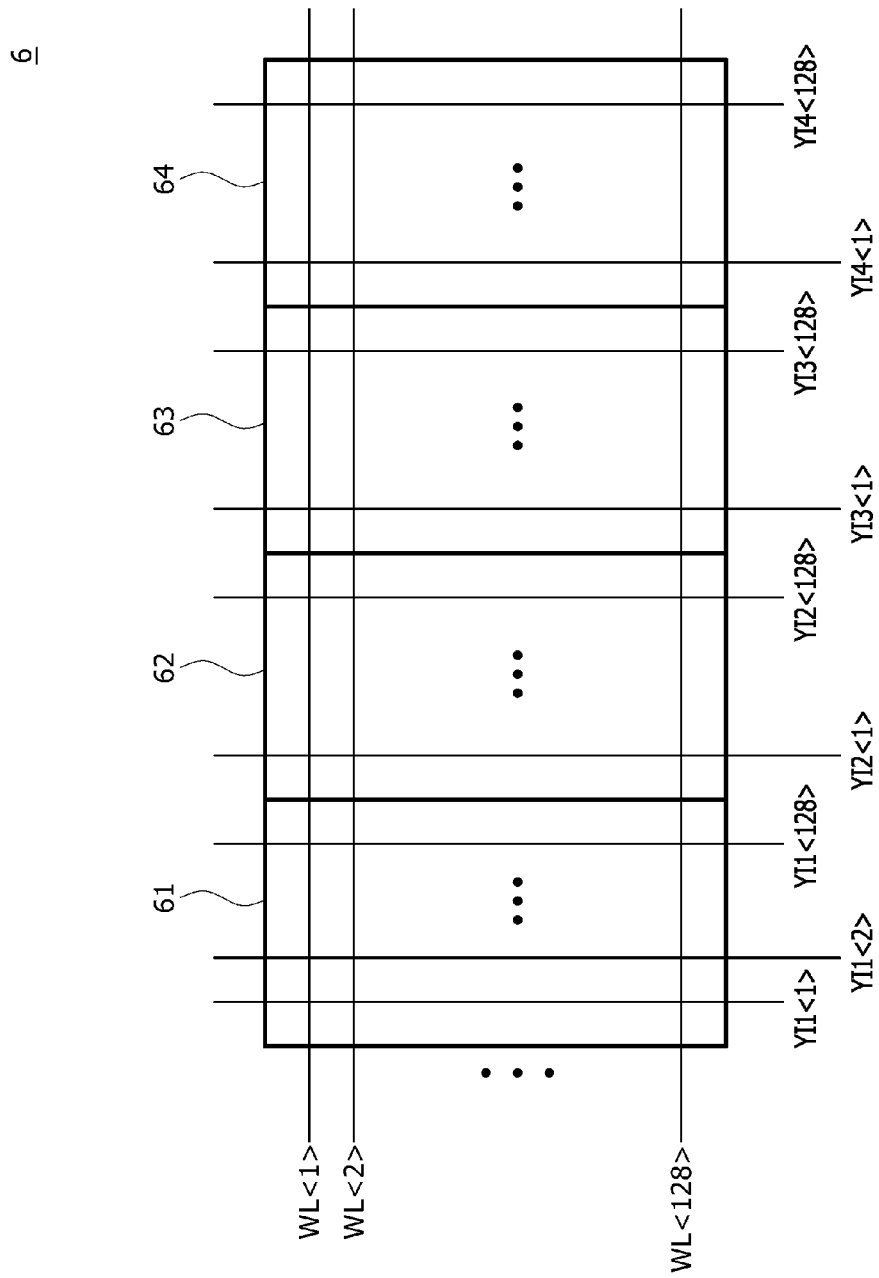
FIG. 4 is a diagram illustrating a representation of an example of the configuration of the core circuit included in the semiconductor device illustrated in FIG. 1.

Referring to FIG. 4, the core circuit 6 may include a first region 61, a second region 62, a third region 63, and a fourth region 64.

The first region 61 may include a cell array which is accessed in response to the word line signal WL<1:128> and the first output select signal YI1<1:128>. The cell array included in the first region 61 may be accessed in response to a bit to be enabled in the word line signal WL<1:128> and a bit to be enabled in the first output select signal YI1<1:128> to perform an internal operation including a write operation.

The second region 62 may include a cell array which is accessed in response to the word line signal WL<1:128> and the second output select signal YI2<1:128>. The cell array included in the second region 62 may be accessed in response to a bit to be enabled in the word line signal WL<1:128> and a bit to be enabled in the second output select signal YI2<1:128> to perform the internal operation including the write operation.

The third region 63 may include a cell array which is accessed in response to the word line signal WL<1:128> and the third output select signal YI3<1:128>. The cell array included in the third region 63 may be accessed in response to a bit to be enabled in the word line signal WL<1:128> and a bit to be enabled in the third output select signal YI3<1:128> to perform the internal operation including the write operation.

The fourth region 64 may include a cell array which is accessed in response to the word line signal WL<1:128> and the fourth output select signal YI4<1:128>. The cell array included in the fourth region 64 may be accessed in response to a bit to be enabled in the word line signal WL<1:128> and a bit to be enabled in the fourth output select signal YI4<1:128> to perform the internal operation including the write operation.

Figure 5:
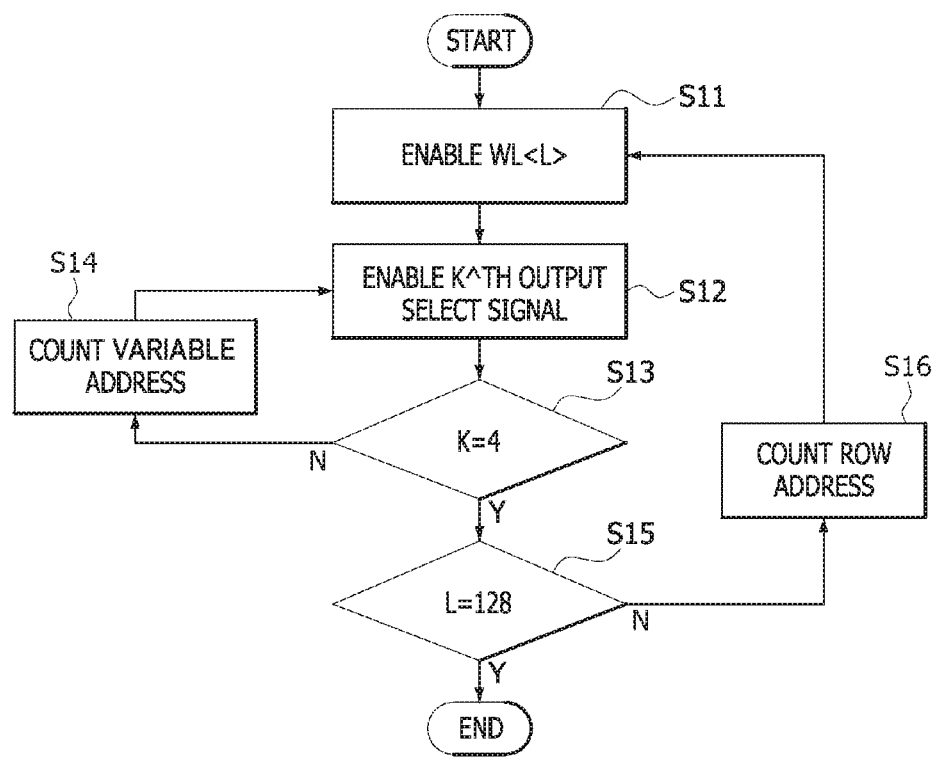
FIG. 5 is a representation of an example of a flow chart to assist in the explanation of a test operation performed in the semiconductor device illustrated in FIG. 1.

The test operation of a semiconductor device configured as mentioned above will be described below with reference to FIG. 5, on the assumption that a write operation accompanied by address substitution is performed in a state in which word lines are configured by 128 bits and each of four output select signals is configured by 128 bits.

In the case where both the operation control signal FWT and the test mode signal TM are enabled as the write operation accompanied by address substitution is performed, the write operation is performed for all the cell arrays included in the core circuit 6.

After an active operation in which the first bit included in the word lines is enabled is performed (S11), all the bits included in the first output select signal are enabled sequentially, and the write operation is performed sequentially for a cell array to be accessed (S12). Determination is made for whether an enabled output select signal is the fourth output select signal (i.e., K=4)(S13). In the case where an enabled output select signal is not the fourth output select signal, by counting a variable address (S14), output select signals are sequentially enabled until an enabled output select signal is the fourth output select signal.

After all the bits included in the fourth output select signal are enabled, determination is made for whether the 128^th bit included in the word lines is enabled (i.e., L=128)(S15). In the case where the 128^th bit included in the word lines is not enabled, by counting a row address (S16), the operation of performing the active operation (S11) is repeated by sequentially enabling another bit included in the word lines. In the case where the 128^th bit included in the word lines is enabled, the test operation is ended.

Figure 6:
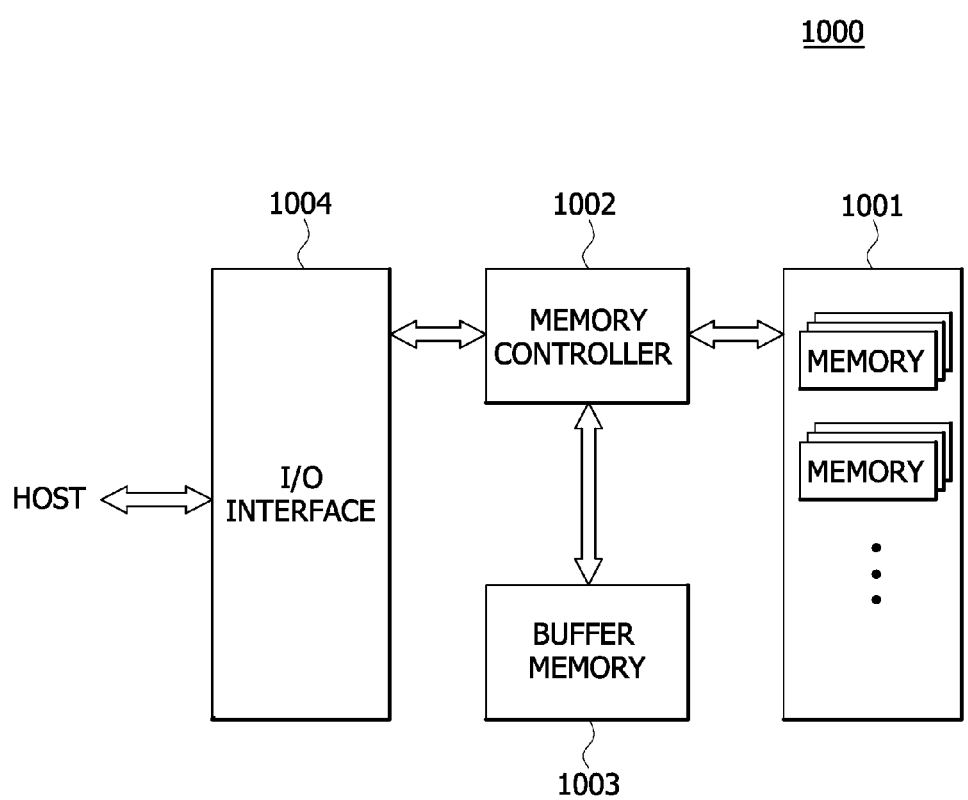
FIG. 6 is a diagram illustrating a representation of an example of the configuration of an electronic system to which the semiconductor device illustrated in FIG. 1 is applied.

The semiconductor devices described above with reference to FIG. 1 may be applied to an electronic system which includes a memory system, a graphic system, a computing system or a mobile system. For example, referring to FIG. 6, an electronic system 1000 in accordance with an embodiment may include a data storage 1001, a memory controller 1002, a buffer memory 1003, and an input and output (input/output) interface 1004.

The data storage 1001 stores data applied from the memory controller 1002, and reads out stored data and outputs the read-out data to the memory controller 1002, according to control signals from the memory controller 1002. The data storage 1001 may include one or more embodiments of the semiconductor devices illustrated in FIG. 1. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. While the memory controller 1002 is illustrated as one block in FIG. 6, a controller for controlling the data storage 1001 and a controller for controlling the buffer memory 1003 as a volatile memory may be independently configured in the memory controller 1002.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the semiconductor device described herein should not be limited based on the described embodiments.

What is claimed is:

1. A semiconductor device comprising:
    an address conversion circuit configured for generating a variable address based on an operation control signal and a test mode signal; and
    a column decoder configured for generating a first output select signal or a second output select signal from a column address based on the variable address,
    wherein the operation control signal is enabled to perform an internal operation while substituting the row address with a column address.

2. The semiconductor device according to claim 1, wherein the internal operation includes a write operation.

3. The semiconductor device according to claim 1, wherein the address conversion circuit generates the variable address which is counted sequentially based on the operation control signal being enabled.

4. The semiconductor device according to claim 1, wherein the address conversion circuit comprises:
    an operating pulse generation circuit configured for generating an operating pulse based on the operation control signal; and
    a flag generation circuit configured for generating a flag signal based on the test mode signal.

5. The semiconductor device according to claim 1, wherein the address conversion circuit further comprises:
    a counter configured for generating a counting address which is counted sequentially, based on the operating pulse which is generated based on the operation control signal being enabled and the flag signal which is generated based on the test mode signal being enabled.

6. The semiconductor device according to claim 5, wherein the address conversion circuit further comprises:
    an address selection circuit configured for selecting and outputting the counting address or a row address as the variable address based on the flag signal.

7. The semiconductor device according to claim 1, wherein the column decoder generates the first output select signal by decoding the column address based on the variable address being a first logic level combination, and generates the second output select signal by decoding the column address based on the variable address being a second logic level combination.

8. The semiconductor device according to claim 1, further comprising:
    an address buffer configured for generating a first bit group of a row address, a second bit group of the row address and the column address from an address based on an active signal, a write signal, and the operation control signal.

9. The semiconductor device according to claim 1, further comprising:
a core circuit configured for performing an internal operation based on a word line signal generated by decoding a row address, the first output select signal and the second output select signal.

10. The semiconductor device according to claim 9, wherein the core circuit comprises:
a first region including a first cell array which is accessed based on the word line signal and the first output select signal; and
a second region including a second cell array which is accessed based on the word line signal and the second output select signal.

11. A semiconductor device comprising:
a counter configured for generating a counting address which is counted sequentially, based on an operating pulse and a flag signal;
an address selection circuit configured for selecting and outputting the counting address or a row address as a variable address based on the flag signal; and
a column decoder configured for generating a first output select signal or a second output select signal from a column address based on the variable address,
wherein the operating pulse is generated based on an operation control signal being enabled, wherein the operation control signal is enabled to perform an internal operation while substituting the row address with a column address.

12. The semiconductor device according to claim 11, wherein the flag signal is generated based on a test mode signal being enabled.

13. The semiconductor device according to claim 11, wherein the column decoder generates the first output select signal by decoding the column address based on the variable address being a first logic level combination, and generates the second output select signal by decoding the column address based on the variable address being a second logic level combination.

14. The semiconductor device according to claim 11, further comprising:
an address buffer configured for generating a first bit group of the row address, a second bit group of the row address and the column address from an address based on an active signal, a write signal, and the operation control signal.

15. The semiconductor device according to claim 11, further comprising:
a core circuit configured for performing an internal operation based on a word line signal generated by decoding the row address, the first output select signal and the second output select signal.

16. The semiconductor device according to claim 15, wherein the core circuit comprises:
a first region including a first cell array which is accessed based on the word line signal and the first output select signal; and
a second region including a second cell array which is accessed based on the word line signal and the second output select signal.

* * * * *